US012564013B2

(12) United States Patent
Inoue et al.

(10) Patent No.: US 12,564,013 B2
(45) Date of Patent: Feb. 24, 2026

(54) MEMBER FOR SEMICONDUCTOR MANUFACTURING APPARATUS

(71) Applicant: NGK Insulators, Ltd., Nagoya (JP)

(72) Inventors: Seiya Inoue, Handa (JP); Tatsuya Kuno, Nagoya (JP); Kanta Miyamoto, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 513 days.

(21) Appl. No.: 18/065,018

(22) Filed: Dec. 13, 2022

(65) Prior Publication Data

US 2023/0197502 A1     Jun. 22, 2023

(30) Foreign Application Priority Data

Dec. 22, 2021     (JP) ................................. 2021-208054

(51) Int. Cl.
*H01L 21/687*     (2006.01)
*H01L 21/67*     (2006.01)
*H01L 21/683*     (2006.01)

(52) U.S. Cl.
CPC .. *H01L 21/68785* (2013.01); *H01L 21/67109* (2013.01); *H01L 21/6833* (2013.01); *H01L 21/6875* (2013.01)

(58) Field of Classification Search
CPC ........... H01L 21/67109; H01L 21/6833; H01L 21/6875; H01L 21/68785
See application file for complete search history.

(56) References Cited

U.S. PATENT DOCUMENTS 5,542,559 A * 8/1996 Kawakami .......... H01J 37/3244
156/345.47
5,720,818 A * 2/1998 Donde ................ C23C 16/4586
118/728
(Continued)

FOREIGN PATENT DOCUMENTS

JP     WO2008099789 A1 * 5/2010 ............. H02N 13/00
JP     2013-232640 A     11/2013
(Continued)

OTHER PUBLICATIONS

Korean Office Action (with English translation) dated Apr. 29, 2024 (Application No. 10-2022-0174920).
(Continued)

*Primary Examiner* — Eric A. Gates
(74) *Attorney, Agent, or Firm* — BURR PATENT LAW, PLLC

(57) ABSTRACT
A member for semiconductor manufacturing apparatus includes: a ceramic plate that has an upper surface including a wafer placement surface; a conductive base that is disposed on a lower surface of the ceramic plate; a first hole that extends through the ceramic plate; a second hole that extends through the conductive base; a porous plug that has an upper surface that is exposed from an upper opening of the first hole and a lower surface that is flush with or below an upper surface of the conductive base; an insulating pipe that has an upper surface that is located below the wafer placement surface and a lower surface that is located below the lower surface of the porous plug; and an integrally formed member that is obtained by integrally forming the porous plug and the insulating pipe.

6 Claims, 6 Drawing Sheets

(56) References Cited

U.S. PATENT DOCUMENTS

| | | | | | |
|---|---|---|---|---|---|
| 6,108,189 | A | * | 8/2000 | Weldon | C23C 16/4586 |
| | | | | | 279/128 |
| 6,490,145 | B1 | * | 12/2002 | Kholodenko | H01L 21/6833 |
| | | | | | 361/234 |
| 9,627,240 | B2 | * | 4/2017 | Yamaguchi | H02N 13/00 |
| 9,960,067 | B2 | * | 5/2018 | Anada | H01L 21/67109 |
| 11,367,597 | B2 | * | 6/2022 | Lee | H01L 21/6831 |
| 11,417,556 | B2 | * | 8/2022 | Shiraishi | H01L 21/68757 |
| 11,424,150 | B2 | * | 8/2022 | Takasaki | H01L 21/68757 |
| 11,456,161 | B2 | * | 9/2022 | Larosa | H01L 21/68785 |
| 11,626,310 | B2 | * | 4/2023 | Shiraishi | H01L 21/6833 |
| | | | | | 324/234 |
| 2007/0131674 | A1 | | 6/2007 | Kushihashi et al. | |
| 2013/0286532 | A1 | | 10/2013 | Kataigi et al. | |
| 2014/0020834 | A1 | | 1/2014 | Zhou et al. | |
| 2017/0352568 | A1 | * | 12/2017 | Cho | H01L 21/6831 |
| 2018/0114716 | A1 | | 4/2018 | Hao et al. | |
| 2019/0035667 | A1 | | 1/2019 | Minemura | |
| 2019/0267277 | A1 | | 8/2019 | Sasaki et al. | |
| 2020/0153595 | A1 | | 5/2020 | Hoshino et al. | |
| 2020/0227291 | A1 | | 7/2020 | Ishikawa et al. | |
| 2020/0279765 | A1 | | 9/2020 | Furukawa | |
| 2020/0294838 | A1 | | 9/2020 | Yoshikawa et al. | |
| 2021/0043489 | A1 | | 2/2021 | Satake | |
| 2024/0195332 | A1 | * | 6/2024 | Akabane | H01L 21/683 |

FOREIGN PATENT DOCUMENTS

| | | | | |
|---|---|---|---|---|
| JP | 2019-029384 | A | 2/2019 | |
| KR | 10-2019-0103025 | A | 9/2019 | |
| KR | 10-2020-0047675 | A | 5/2020 | |
| KR | 10-2020-0109253 | A | 9/2020 | |
| TW | 200735691 | A | 9/2007 | |
| TW | 201250833 | A | 12/2012 | |
| TW | 201834139 | A | 9/2018 | |
| TW | 202025371 | A | 7/2020 | |
| TW | 202111840 | A | 3/2021 | |
| WO | WO-2005122219 | A1 * | 12/2005 | G03F 7/707 |

OTHER PUBLICATIONS

Taiwanese Office Action dated Nov. 8, 2023 (Application No. 111147931).

Chinese Office Action (with English translation) dated Aug. 21, 2025 (Application No. 202211023886.2).

* cited by examiner

Fig. 4A                    Fig. 4B

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A known member for semiconductor manufacturing apparatus includes an electrostatic chuck that has an upper surface including a wafer placement surface. For example, an electrostatic chuck in PTL 1 that includes a ceramic plate on which a wafer is attracted and held, a through-hole that is formed in the ceramic plate, a porous plug that is disposed in the through-hole, and a conductive cooling plate that is stuck to a lower surface of the ceramic plate is disclosed. A lower surface of the porous plug is flushed with the lower surface of the ceramic plate. In the case where the wafer that is placed on the wafer placement surface is processed by plasma, high-frequency power is supplied between the cooling plate and a flat plate electrode that is disposed above the wafer, and the plasma is generated above the wafer. In addition, helium, which is a heat conduction gas, is supplied to a back surface of the wafer via the porous plug in order to improve heat conduction between the wafer and the ceramic plate. Without a porous plug, electrons that are generated by ionization of helium are accelerated and collide with another helium, and arc discharge occurs. The porous plug inhibits arc discharge from occurring because the electrons collide with the porous plug before the electrons collide with the other helium.

CITATION LIST

Patent Literature

PTL 1 Japanese Unexamined Patent Application Publication No. 2019-29384

SUMMARY OF THE INVENTION

As power for a process increases, however, an electric potential difference between the wafer and the cooling plate increases. As for the electrostatic chuck described above, the voltage resistance of the porous plug itself is low. Accordingly, in some cases, spark discharge occurs in the porous plug, and the quality of the wafer changes.

The present invention has been accomplished to solve the problem, and it is a main object of the present invention to provide a member for semiconductor manufacturing apparatus that includes a porous plug and that inhibits arc discharge and spark discharge from occurring between a wafer and a conductive base.

A member for semiconductor manufacturing apparatus of the present invention includes: a ceramic plate that has an upper surface including a wafer placement surface; a conductive base that is disposed on a lower surface of the ceramic plate; a first hole that extends through the ceramic plate in an up-down direction; a second hole that extends through the conductive base in the up-down direction and that is in communication with the first hole; a porous plug that has an upper surface that is exposed from an upper opening of the first hole and a lower surface that is flush with or below an upper surface of the conductive base; an insulating pipe that has an upper surface that is located below the wafer placement surface and a lower surface that is located below the lower surface of the porous plug; and an integrally formed member that is obtained by integrally forming the porous plug and the insulating pipe and securing an outer circumferential surface in the first hole and the second hole by using an adhesive layer that extends from an upper surface of the first hole into the second hole.

As for the member for semiconductor manufacturing apparatus, the lower surface of the porous plug is flush with or below the upper surface of the conductive base (preferably below the upper surface of the conductive base). In the case where the lower surface of the porous plug is located above the upper surface of the conductive base, arc discharge occurs between the lower surface of the porous plug and the conductive base. In the case where the lower surface of the porous plug is flush with or below the upper surface of the conductive base, arc discharge can be inhibited from occurring. The lower surface of the insulating pipe is located below the lower surface of the porous plug. For this reason, the creepage distance of insulation from a wafer to the conductive base is longer than that in the case where no insulating pipe is provided, and spark discharge can be inhibited from occurring in the porous plug. Accordingly, arc discharge and spark discharge can be inhibited from occurring between the wafer and the conductive base of the member for semiconductor manufacturing apparatus that includes the porous plug.

In the present specification, the words "up-down", "left-right", and "front-rear" are used to describe the present invention in some cases, but the words "up-down", "left-right", and "front-rear" merely represent relative positional relationships. For this reason, the word "up-down" is changed into the word "left-right" or the word "left-right" is changed into the word "up-down" in some cases where the direction of the member for semiconductor manufacturing apparatus is changed. These cases are also included in the technical scope of the present invention.

As for member for semiconductor manufacturing apparatus according to the present invention, a width of the adhesive layer inside the second hole may be more than that inside the first hole outward in a radial direction. Consequently, when the adhesive layer is formed by using an adhesive, the adhesive can be filled while bubbles are inhibited from entering the adhesive that is located inside the second hole.

As for the member for semiconductor manufacturing apparatus according to the present invention, an inner circumferential surface around the second hole may have an enlarged-diameter portion a diameter of which increases upward from below, and the adhesive layer may be located between the enlarged-diameter portion and the insulating pipe. Also, in this way, when the adhesive layer is formed by using the adhesive, bubbles are likely to be prevented from entering the adhesive that is located inside the second hole.

As for the member for semiconductor manufacturing apparatus according to the present invention, the insulating pipe may include a pipe upper portion that has a bottomed hole, and the porous plug may be held with the porous plug inserted in the bottomed hole. Consequently, it is not necessary to process the porous plug that is relatively fragile for shaping in a complex manner.

As for the member for semiconductor manufacturing apparatus according to the present invention, the wafer placement surface may have a large number of small projections that support a wafer, and the upper surface of the porous plug may be lower than upper surfaces of the small projections. Consequently, the upper surface of the porous plug does not lift the wafer. In this case, the upper surface of the porous plug may be flush with a reference surface of the wafer placement surface on which the small projections are not formed or may be lower than the reference surface by 0.2 mm or less. This enables the height of a space between a back surface of the wafer and the upper surface of the porous plug to be decreased, and arc discharge can be prevented from occurring in the space.

BRIEF DESCRIPTION OF THE DRAWINGS

FIGS. 4A and 4B illustrate a process of manufacturing an integrally formed member As.

DETAILED DESCRIPTION OF THE INVENTION

Figure 1:
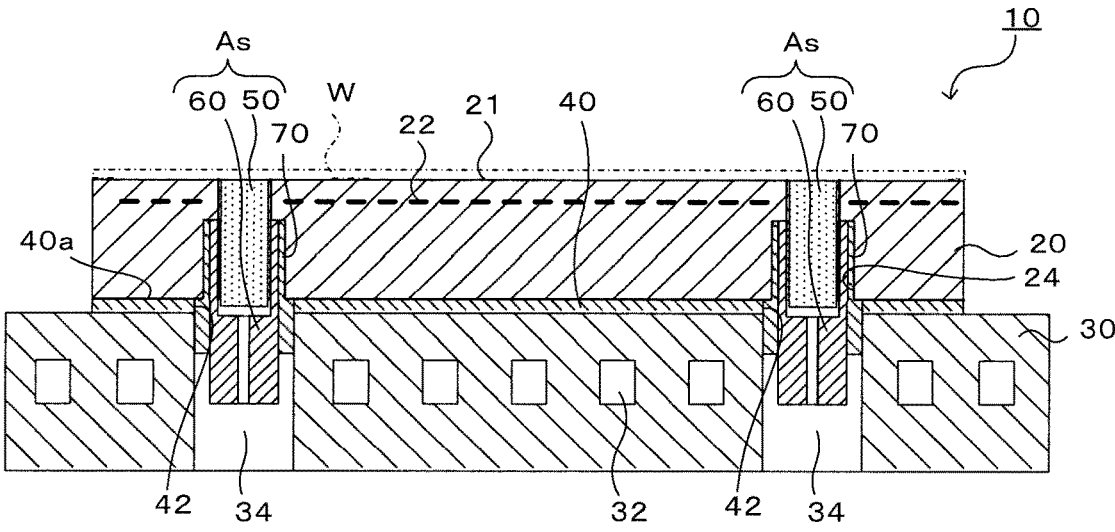
FIG. 1 illustrates a vertical cross-section of a member 10 for semiconductor manufacturing apparatus.
Figure 2:
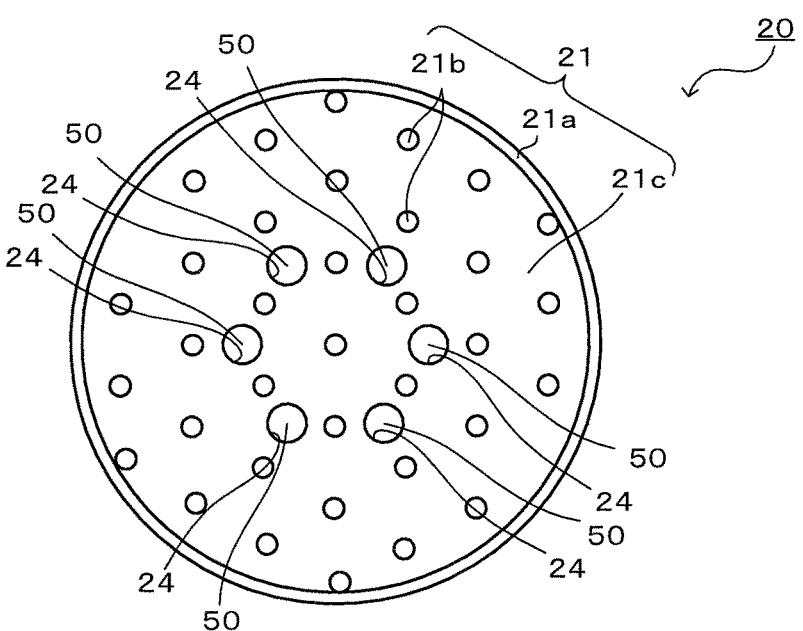
FIG. 2 illustrates a plan view of a ceramic plate 20.
Figure 3:
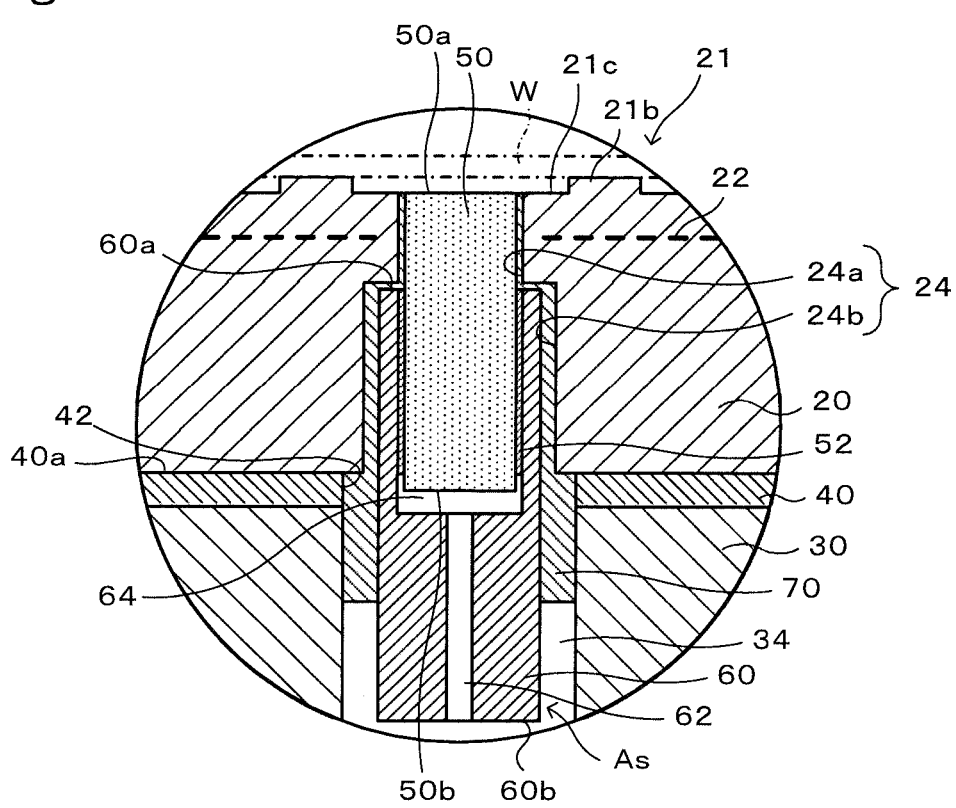
FIG. 3 illustrates a partially enlarged view of a part in FIG. 1.

A preferred embodiment of the present invention will now be described with reference to the drawings. FIG. 1 illustrates a vertical cross-section of a member 10 for semiconductor manufacturing apparatus. FIG. 2 illustrates a plan view of a ceramic plate 20. FIG. 3 illustrates a partially enlarged view of a part in FIG. 1.

The member 10 for semiconductor manufacturing apparatus includes the ceramic plate 20, a cooling plate 30, a metal joining layer 40, porous plugs 50, and insulating pipes 60.

The ceramic plate 20 is a ceramic disk (having, for example, a diameter of 300 mm and a thickness of 5 mm) such as an alumina sintered body or an aluminum nitride sintered body. An upper surface of the ceramic plate 20 is a wafer placement surface 21. The ceramic plate 20 contains an electrode 22. As illustrated in FIG. 2, a seal band 21a is formed on the wafer placement surface 21 of the ceramic plate 20 along an outer edge, and multiple circular small projections 21b are formed on the entire surface. The seal band 21a and the circular small projections 21b have the same height, and the height thereof is, for example, several μm to several tens of μm. The electrode 22 is a mesh electrode that is used as an electrostatic electrode and that has a flat plate shape, and a direct voltage can be applied thereto. When the direct voltage is applied to the electrode 22, a wafer W is attracted and secured to the wafer placement surface 21 (specifically, an upper surface of the seal band 21a and upper surfaces of the circular small projections 21b) due to electrostatic attraction force. When applying the direct voltage ends, the wafer W that is attracted and secured to the wafer placement surface 21 is released. A portion of the wafer placement surface 21 on which the seal band 21a and the circular small projections 21b are not formed is referred to as a reference surface 21c.

The ceramic plate 20 has first holes 24. The first holes 24 are through-holes that extend through the ceramic plate 20 and the electrode 22 in an up-down direction. As illustrated in FIG. 3, each of the first holes 24 is a hole with a step, a hole upper portion 24a is thin, and a hole lower portion 24b is thick. That is, each of the first holes 24 is obtained by connecting the hole upper portion 24a that has a small diameter and a columnar shape and the hole lower portion 24b that has a large diameter and a columnar shape to each other. The first holes 24 are formed at multiple positions (for example, multiple positions equally spaced from each other in a circumferential direction) in the ceramic plate 20.

The cooling plate 30 is a disk (a disk that has a diameter equal to or larger than the diameter of the ceramic plate 20) that has good thermal conductivity. The cooling plate 30 contains a refrigerant flow path 32 through which refrigerant circulates and gas holes 34 in which gas is supplied to the porous plugs 50. The refrigerant flow path 32 is formed in a one-stroke pattern from an inlet to an outlet over the entire cooling plate 30 in a plan view. The gas holes 34 have a columnar shape and are formed coaxially with the first holes 24 and in communication with the first holes 24. The diameters of the gas holes 34 are larger than the diameters of the hole lower portions 24b of the first holes 24. Examples of the material of the cooling plate 30 include a metal material and a metal matrix composite material (MMC). Examples of the metal material include Al, Ti, Mo, or an alloy thereof. Examples of the MMC include a material containing Si, SiC, and Ti (also referred to as SiSiCTi) and a material obtained by impregnating a SiC porous body with Al and/or Si. A material that has a thermal expansion coefficient close to that of the ceramic plate 20 is preferably selected as the material of the cooling plate 30. The cooling plate 30 is also used as a RF electrode. Specifically, an upper electrode (not illustrated) is disposed above the wafer placement surface 21, and plasma is generated when high-frequency power is supplied between parallel flat plate electrodes that include the upper electrode and the cooling plate 30.

The metal joining layer 40 joins the lower surface of the ceramic plate 20 and the upper surface of the cooling plate 30 to each other. The metal joining layer 40 is formed by, for example, TCB (Thermal compression bonding). The TCB is a known method of compressing and joining two members in a state in which the two members to be joined interpose a metal joining material therebetween and are heated to a temperature equal to or less than the solidus temperature of the metal joining material. The metal joining layer 40 has through-holes 42 that extend therethrough in the up-down direction and that are in communication with the first holes 24 of the ceramic plate 20 and the gas holes 34 of the cooling plate 30. The diameters of the through-holes 42 are equal to the diameters of the gas holes 34. The metal joining layer 40 and the cooling plate 30 according to the present embodiment correspond to a conductive base according to the present invention. The through-holes 42 and the gas holes 34 according to the present embodiment correspond to second holes according to the present invention.

The porous plugs 50 are columnar porous members that allow the gas to flow in the up-down direction. The porous plugs 50 are composed of an electrical insulation material such as alumina. Upper surfaces 50a of the porous plugs 50 are exposed from upper openings of the first holes 24 and are on the same plane as the reference surface 21c. The word "same" includes not only a case of being completely the same but also a case of being substantially the same (for example, a case of being within tolerance) (the same is true for the following description). Lower surfaces 50b of the porous plugs 50 are flush with or below an upper surface 40a of the metal joining layer 40 and are located inside the through-holes 42 (below the upper surface 40a of the metal joining layer 40) here.

The insulating pipes 60 are cylindrical pipes composed of dense ceramic and contain gas paths 62. Bottomed holes 64 that have a diameter larger than the diameters of the gas paths 62 are formed in upper portions of the insulating pipes 60. Upper surfaces 60a of the insulating pipes 60 are located below the wafer placement surface 21. Lower surfaces 60b of the insulating pipes 60 are located below the lower surfaces 50b of the porous plugs 50 and are located inside the gas holes 34 of the cooling plate 30 here. The insulating pipes 60 and the porous plugs 50 are integrally formed into integrally formed members As. The integrally formed members As are held by holding layers 52 composed of an adhesive with the porous plugs 50 inserted in the bottomed holes 64 of the insulating pipes 60. There are gaps between the bottom surfaces of the bottomed holes 64 and the lower surfaces 50b of the porous plugs 50. The gaps facilitate adjustment of the heights of the porous plugs 50.

The integrally formed members As are inserted in the gas holes 34, the through-holes 42, and the first holes 24. The outer circumferential surfaces of the integrally formed members As are secured in the first holes 24, the through-holes 42, and the gas holes 34 by using adhesive layers 70 that extend from edges around the upper openings of the first holes 24 of the ceramic plate 20 into the gas holes 34 of the cooling plate 30 and that are composed of an adhesive. The widths of the adhesive layers 70 in the horizontal direction are narrow at the hole upper portions 24a of the first holes 24, are wide in the through-holes 42 and the gas holes 34, and are intermediate at the hole lower portions 24b of the first holes 24. That is, the widths of the adhesive layers 70 inside the through-holes 42 and the gas holes 34 are more than the widths of the adhesive layers 70 inside the first holes 24 outward in a radial direction. For this reason, the adhesive layers 70 inside the gas holes 34 can relatively easily prevent bubbles from entering the adhesive layers 70. This will be described later.

An example of the use of the member 10 for semiconductor manufacturing apparatus thus configured will now be described. The wafer W is first placed on the wafer placement surface 21 with the member 10 for semiconductor manufacturing apparatus installed in a chamber not illustrated. The pressure of the chamber is decompressed by a vacuum pump and is adjusted such that a predetermined degree of vacuum is achieved. A direct voltage is applied to the electrode 22 of the ceramic plate 20 to generate electrostatic attraction force, and the wafer W is attracted and secured to the wafer placement surface 21 (specifically, the upper surface of the seal band 21a and the upper surfaces of the circular small projections 21b). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the cooling plate 30 of the member 10 for semiconductor manufacturing apparatus, and plasma is generated. The surface of the wafer W is processed by the generated plasma. The refrigerant circulates through the refrigerant flow path 32 of the cooling plate 30. Backside gas is introduced into the gas holes 34 from a gas tank not illustrated. Heat conduction gas (such as helium) is used as the backside gas. The backside gas passes through the gas holes 34, the insulating pipes 60, and the porous plugs 50, is supplied to a space between the back surface of the wafer W and the reference surface 21c of the wafer placement surface 21, and is sealed. The backside gas enables heat conduction between the wafer W and the ceramic plate 20 to be efficient.

Figures 5A, 5B, 5C:
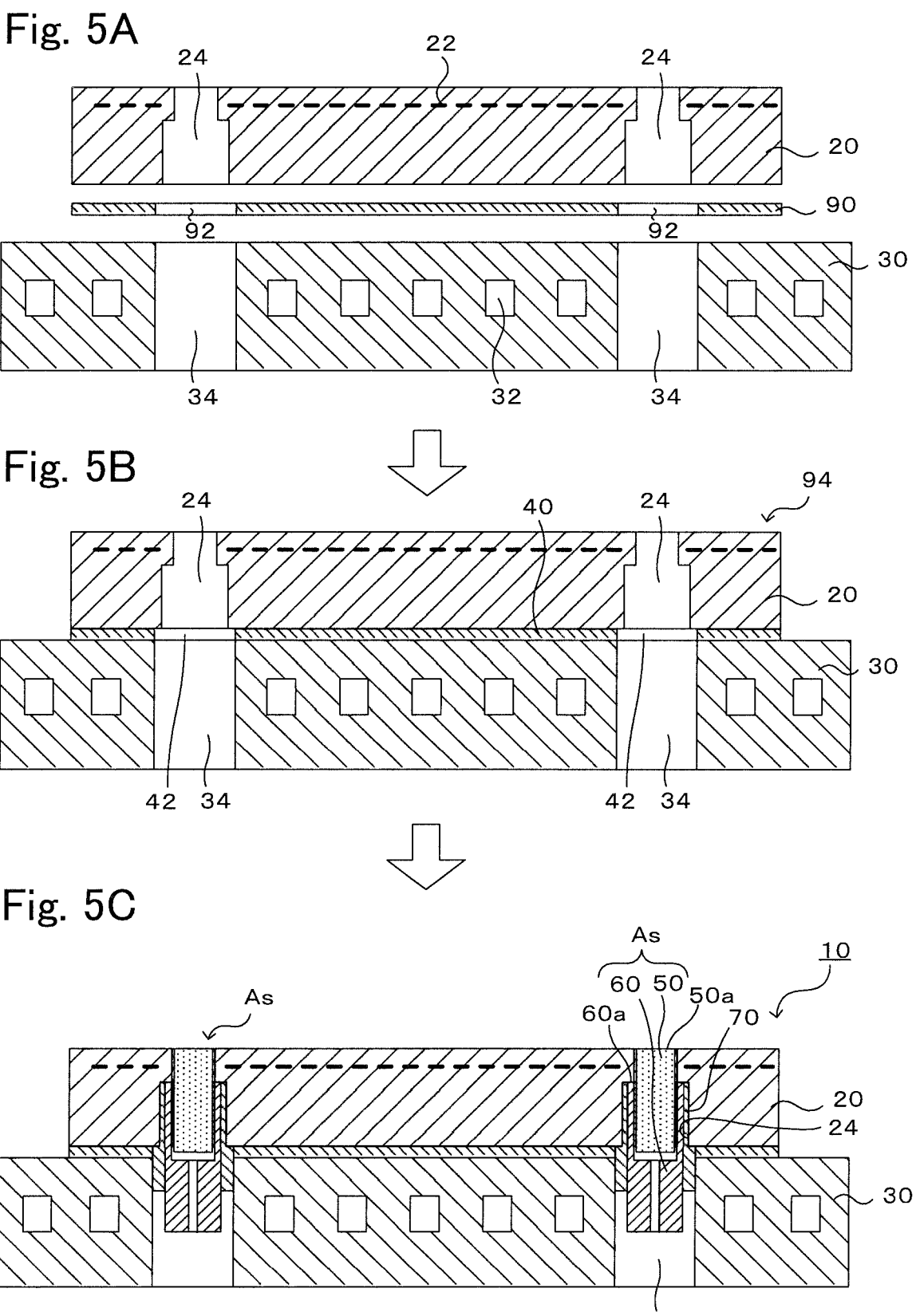
FIGS. 5A to 5C illustrate a process of manufacturing the member 10 for semiconductor manufacturing apparatus.

An example of manufacturing the member 10 for semiconductor manufacturing apparatus will now be described with reference to FIGS. 4A and 4B and FIGS. 5A to 5C. FIGS. 4A and 4B illustrate a process of manufacturing the integrally formed member As. FIGS. 5A to 5C illustrate a process of manufacturing the member 10 for semiconductor manufacturing apparatus. The porous plugs 50 and the insulating pipes 60 are first prepared (FIG. 4A), an adhesive is applied to inner circumferential surfaces around the bottomed holes 64 of the insulating pipes 60, and the porous plugs 50 are inserted into the bottomed holes 64 and are stuck. Consequently, the integrally formed members As are obtained (FIG. 4B). The adhesive is hardened and becomes the holding layers 52.

Separately from this, the ceramic plate 20, the cooling plate 30, and a metal joining material 90 are prepared (FIG. 5A). The ceramic plate 20 contains the electrode 22 and has the first holes 24. The cooling plate 3U contains the refrigerant flow path 32 and has the gas holes 34. Preliminary holes 92 are formed at positions corresponding to those of the through-holes 42 in the metal joining material 90 in advance.

The lower surface of the ceramic plate 20 and the upper surface of the cooling plate 30 are joined to each other by using the TCB, and a joined body 94 is obtained (FIG. 5B). The TCB is performed, for example, in the following manner. The metal joining material 90 is put between the lower surface of the ceramic plate 20 and the upper surface of the cooling plate 30, and a layered body is obtained. At this time, these are stacked such that the first holes 24 of the ceramic plate 20, the preliminary holes 92 of the metal joining material 90, and the gas holes 34 of the cooling plate 30 are coaxial with each other. The layered body is compressed and joined at a temperature equal to or less than the solidus temperature of the metal joining material 90 (for example, no less than a temperature obtained by subtracting 20° C. from the solidus temperature and no more than the solidus temperature), and subsequently, the temperature is returned to the room temperature. Consequently, the metal joining material 90 becomes the metal joining layer 40, the preliminary holes 92 becomes the through-holes 42, and the joined body 94 in which the ceramic plate 20 and the cooling plate 30 are joined to each other by the metal joining layer 40 is obtained. At this time, an Al—Mg joining material or an Al—Si—Mg joining material can be used as the metal joining material. For example, in the case where the Al—Si—Mg joining material is used for the TCB, the layered body is compressed while being heated in a vacuum atmosphere. The thickness of the metal joining material 90 is preferably about 100 μm.

Subsequently, an adhesive is applied to inner circumferential surfaces around the first holes 24 of the ceramic plate 20, inner circumferential surfaces around the through-holes 42 of the metal joining layer 40, and inner circumferential surfaces around the gas holes 34 of the cooling plate 30. While the adhesive is degassed by evacuating the first holes 24, the through-holes 42, and the gas holes 34 with the upper openings of the first holes 24 closed, the integrally formed members As are inserted into the holes 34, 42, and 24. Gaps between the inner circumferential surfaces around the through-holes 42 and the outer circumferential surfaces of the integrally formed members As and gaps between the inner circumferential surfaces around the gas holes 34 and the outer circumferential surfaces of the integrally formed members As are wider than gaps between the inner circumferential surfaces around the first holes 24 and the outer circumferential surfaces of the integrally formed members As. For this reason, the adhesive is likely to be degassed in the through-holes 42 and the gas holes 34. It is designed that when the upper surfaces 60*a* of the insulating pipes 60 of the integrally formed members As collide with the steps of the first holes 24, the upper surfaces 50*a* of the porous plugs 50 are on the same plane as the reference surface 21*c* (see FIG. 3) of the wafer placement surface 21. Subsequently, the adhesive is hardened and becomes the adhesive layers 70, and the member 10 for semiconductor manufacturing apparatus is obtained (FIG. 5C).

As for the member 10 for semiconductor manufacturing apparatus described in detail above, the lower surfaces 50*b* of the porous plugs 50 are flush with or below the upper surface 40*a* of the metal joining layer 40. In the case where the lower surfaces 50*b* of the porous plugs 50 are located above the upper surface 40*a* of the metal joining layer 40, arc discharge occurs between the lower surfaces 50*b* of the porous plugs 50 and the conductive base (the metal joining layer 40 and the cooling plate 30). In the case where the lower surfaces 50*b* of the porous plugs 50 are flush with or below the upper surface 40*a* of the metal joining layer 40, arc discharge can be inhibited from occurring. The lower surfaces 60*b* of the insulating pipes 60 are located below the lower surfaces 50*b* of the porous plugs 50. For this reason, the creepage distance of insulation from the wafer W to the conductive base is longer than that in the case where no insulating pipes are provided, and spark discharge can be inhibited from occurring in the porous plugs 50. Accordingly, arc discharge and spark discharge can be inhibited from occurring between the wafer W and the conductive base.

The widths of the adhesive layers 70 inside the through-holes 42 of the metal joining layer 40 and the widths inside the gas holes 34 of the cooling plate 30 are more than those inside the first holes 24 outward in the radial direction. For this reason, when the adhesive layers 70 are formed by using the adhesive, the adhesive can be filled while bubbles are inhibited from entering the adhesive that is located in the through-holes 42 and the gas holes 34. Accordingly, the porosity of the adhesive layers 70 that are located in the through-holes 42 and the gas holes 34 can be decreased.

The insulating pipes 60 include pipe upper portions that have the bottomed holes 64. The porous plugs 50 are stuck and secured with the porous plugs 50 inserted in the bottomed holes 64. For this reason, it is not necessary to process the porous plugs 50 that are relatively fragile for shaping.

The upper surfaces 50*a* of the porous plugs 50 are lower than the upper surface of the seal band 21*a* and the upper surfaces of the circular small projections 21*b*. For this reason, the upper surfaces 50*a* of the porous plugs 50 do not lift the wafer W.

The upper surfaces 50*a* of the porous plugs 50 are flush with the reference surface 21*c* of the wafer placement surface 21. For this reason, the heights of spaces between the lower surface of the wafer W and the upper surfaces 50*a* of the porous plugs 50 can be decreased. Accordingly, arc discharge can be prevented from occurring in the spaces.

As for the insulating pipes 60 that are used, the diameters of the gas paths 62 are smaller than the diameters of the bottomed holes 64. For this reason, gaseous heat transfer is less than that in the case where the inner diameters of the gas paths 62 are equal to the inner diameters of the bottomed holes 64 (heat is more likely to be transferred through the insulating pipes 60 than helium, the volumes of the insulating pipes 60 increase, and accordingly, the gaseous heat transfer is reduced), and the thermal uniformity of the wafer W is improved. In addition to this, insulation distances from the gas paths 62 to the cooling plate 30 can be ensured, and accordingly, a dielectric withstand voltage increases.

The present invention is not limited to the above-described embodiment, and can be carried out by various modes as long as they belong to the technical scope of the invention.

Figure 6:
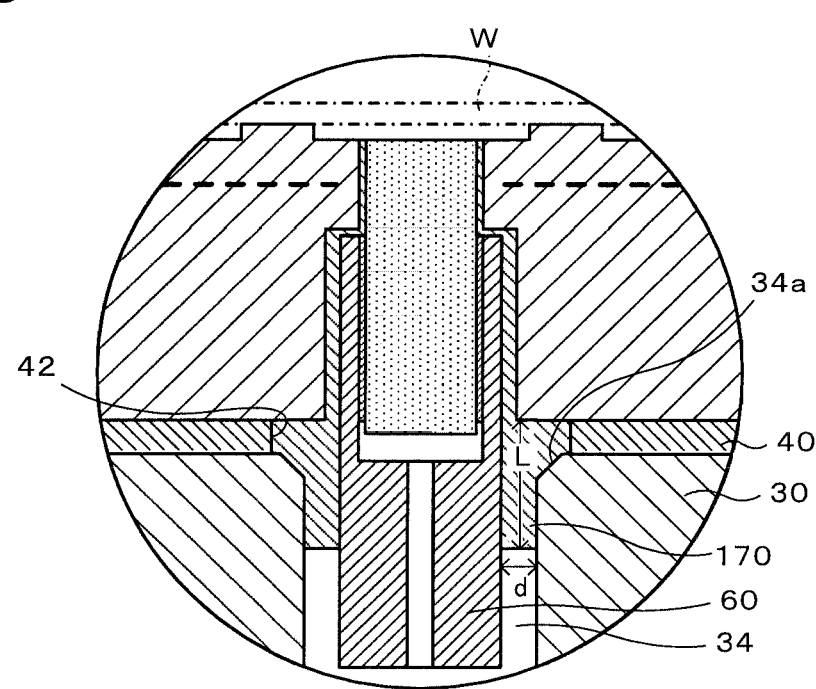
FIG. 6 illustrates a partially enlarged view of an adhesive layer 170 and the vicinity thereof.

According to the embodiment described above, as illustrated in FIG. 6, circumferential edges 34*a* around the upper openings of the gas holes 34 of the cooling plate 30 may be chamfered. The chamfered circumferential edges 34*a* correspond to enlarged-diameter portions each of which has a diameter that increases upward from below. Adhesive layers 170 are located between the circumferential edges 34*a* and the insulating pipes 60. The inner circumferential surfaces around the second holes (the through-holes 42 of the metal joining layer 40 and the gas holes 34 of the cooling plate 30) have the circumferential edges 34*a* corresponding to the enlarged-diameter portions. Also, in this way, when the adhesive layers 170 are formed by using the adhesive, bubbles are likely to be prevented from entering the adhesive that is located inside the through-holes 42 of the metal joining layer 40 and inside the gas holes 34 of the cooling plate 30. The circumferential edges 34*a* are preferably chamfered in C0.1 or more. Distances d between the side surfaces of the insulating pipes 60 and the side surfaces of the gas holes 34 are preferably 2 mm or more. Consequently, the creepage distance of insulation from the wafer W to the cooling plate 30 is sufficiently long. Distances L from the lower surface of the ceramic plate 20 to the lower surfaces of the adhesive layers 170 are preferably 1 mm or more, more preferably 3 mm or more. Consequently, the creepage distance of insulation from the wafer W to the cooling plate 30 is sufficiently long. Spaces (heat insulating layers) between the cooling plate 30 and the insulating pipes 60 can be filled with the adhesive layers 170 that have heat conduction higher than that of the spaces, heat is likely to be transmitted from the insulating pipes 60 to the cooling plate 30, and accordingly, the thermal uniformity of the wafer W is improved. In FIG. 6, a resin adhesive layer may be used instead of the metal joining layer 40. Also, in this case, the inner circumferential surfaces around the second holes (the gas holes 34 of the cooling plate 30) have the circumferential edges 34*a* corresponding to the enlarged-diameter portions.

Figure 7:
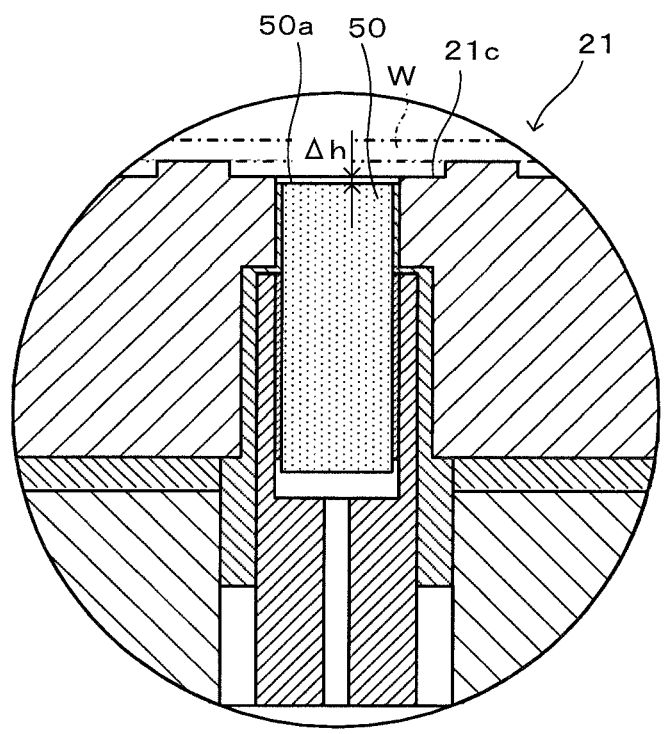
FIG. 7 illustrates a partially enlarged view of a modification to a porous plug 50.

According to the embodiment described above, the upper surfaces 50*a* of the porous plugs 50 and the reference surface 21*c* of the wafer placement surface 21 are flush with each other but are not particularly limited thereto. For example, as illustrated in FIG. 7, a difference Δh obtained by subtracting the height of the upper surface 50*a* of each porous plug 50 from the height of the reference surface 21*c* of the wafer placement surface 21 may be 0.2 mm or less (preferably 0.1 mm or less). In other words, the upper surfaces 50*a* of the porous plugs 50 may be lower than the reference surface 21*c* of the wafer placement surface 21 by 0.2 mm or less (preferably 0.1 mm or less). Also, this enables the heights of the spaces between the lower surface of the wafer W and the upper surfaces 50*a* of the porous plugs 50 to be relatively low. Accordingly, arc discharge can be prevented from occurring in the spaces.

Figure 8:
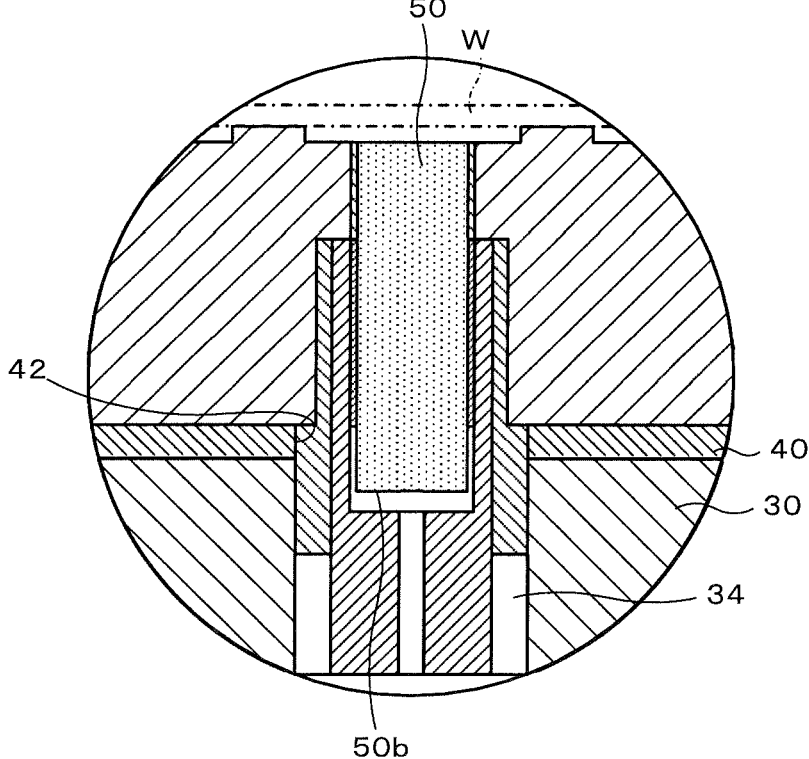
FIG. 8 illustrates a partially enlarged view of a modification to the porous plug 50.

According to the embodiment described above, the lower surfaces 50b of the porous plugs 50 are located inside the through-holes 42 of the metal joining layer 40 (that is, below the upper surface 40a of the metal joining layer 40) but are not particularly limited thereto. For example, as illustrated in FIG. 8, the lower surfaces 50b of the porous plugs 50 may be located inside the gas holes 34 of the cooling plate 30 (that is, below the upper surface of the cooling plate 30). Also, in this way, the same effects as those according to the embodiment described above are achieved. This structure is particularly effective in the case where a resin adhesive layer is used instead of the metal joining layer 40. In the case where the lower surfaces 50b of the porous plugs 50 are located inside through-holes in the resin adhesive layer, an electric potential difference is made between the lower surfaces 50b of the porous plugs 50 and the cooling plate 30. The structure in FIG. 8 eliminates the electric potential difference. In the case where the resin adhesive layer is used instead of the metal joining layer 40 in FIG. 8, the cooling plate 30 corresponds to the conductive base according to the present invention, and the gas holes 34 correspond to the second holes.

Figure 9:
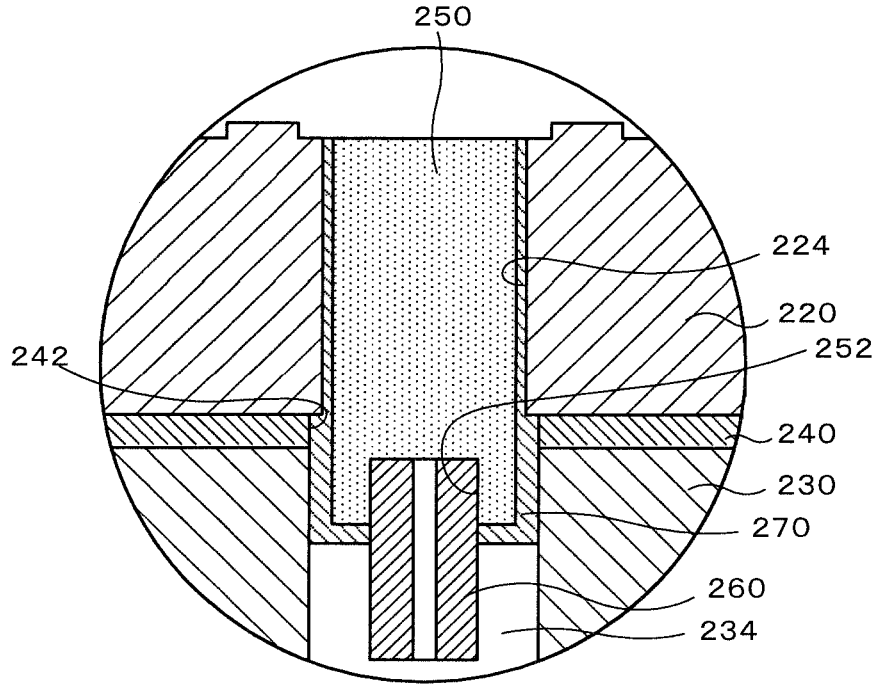
FIG. 9 illustrates a partially enlarged view of a porous plug 250 and the vicinity thereof.
Figure 10:
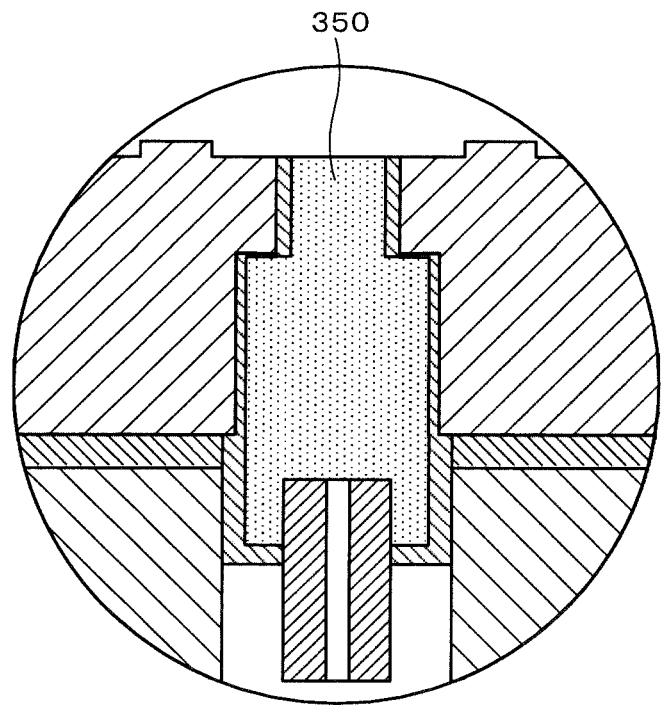
FIG. 10 illustrates a partially enlarged view of a porous plug 350 and the vicinity thereof.

According to the embodiment described above, the porous plugs 50 are inserted into the bottomed holes 64 that are formed in the pipe upper portions of the insulating pipes 60, stuck, and secured but are not particularly limited thereto. For example, as illustrated in FIG. 9, a bottomed hole 252 may be formed in a lower surface of a porous plug 250, and an insulating pipe 260 that has a diameter smaller than that of the porous plug 250 may be inserted into the bottomed hole 252, stuck, and secured. In this case, the integrally formed member of the porous plug 250 and the insulating pipe 260 is stuck and secured by an adhesive layer 270 that is disposed between the outer circumferential surface of the porous plug 250 and inner circumferential surfaces around holes (a first hole 224 of a ceramic plate 220, a through-hole 242 of a metal joining layer 240, and a gas hole 234 of a cooling plate 230). The adhesive layer 270 is formed also in the lower surface (except for a bottomed hole) of the porous plug 250. A porous plug 350 with a step in FIG. 10 may be used instead of the porous plug 250 that has a columnar shape in FIG. 9.

According to the embodiment described above, an electrostatic electrode is taken as an example of the electrode 22 that is contained in the ceramic plate 20, but this is not a particular limitation. For example, a heater electrode (a resistance heating element) may be contained in the ceramic plate 20 instead of or in addition to the electrode 22.

The present application claims priority from Japanese Patent Application No. 2021-208054 filed Dec. 22, 2021, the entire contents of which are incorporated herein by reference.

What is claimed is:

1. A member for semiconductor manufacturing apparatus comprising:

a ceramic plate that has an upper surface including a wafer placement surface;

a conductive base that is disposed on a lower surface of the ceramic plate;

a first hole that extends through the ceramic plate in an up-down direction;

a second hole that extends through the conductive base in the up-down direction and that is in communication with the first hole;

a porous plug that has an upper surface that is exposed from an upper opening of the first hole and a lower surface that is flush with or below an upper surface of the conductive base;

an insulating pipe that has an upper surface that is located below the wafer placement surface and a lower surface that is located below the lower surface of the porous plug; and an integrally formed member that is obtained by integrally forming the porous plug and the insulating pipe and securing an outer circumferential surface in the first hole and the second hole by using an adhesive layer that extends from an upper surface of the first hole into the second hole.

2. The member for semiconductor manufacturing apparatus according to claim 1,
wherein a width of the adhesive layer inside the second hole is more than that inside the first hole outward in a radial direction.

3. The member for semiconductor manufacturing apparatus according to claim 1,
wherein an inner circumferential surface around the second hole has an enlarged-diameter portion a diameter of which increases upward from below, and the adhesive layer is located between the enlarged-diameter portion and the insulating pipe.

4. The member for semiconductor manufacturing apparatus according to claim 1,
wherein the insulating pipe includes a pipe upper portion that has a bottomed hole, and the porous plug is held with the porous plug inserted in the bottomed hole.

5. The member for semiconductor manufacturing apparatus according to claim 1,
wherein the wafer placement surface has a plurality of small projections that support a wafer, and
wherein the upper surface of the porous plug is lower than upper surfaces of the small projections.

6. The member for semiconductor manufacturing apparatus according to claim 5,
wherein the upper surface of the porous plug is flush with a reference surface of the wafer placement surface on which the small projections are not formed or is lower than the reference surface by 0.2 mm or less.

* * * * *